(12) United States Patent
Shindoh et al.

(10) Patent No.: US 6,411,194 B2
(45) Date of Patent: Jun. 25, 2002

(54) PRODUCTION METHOD OF THIN FILM RESISTANCE ELEMENT FORMED ON PRINTED CIRCUIT BOARD, AND THIN FILM RESISTANCE ELEMENT EMPLOYING THE METHOD

(75) Inventors: Motoshi Shindoh, Fujisawa; Keiji Segawa, Sagamihara; Mitsuru Otsuki, Yokohama, all of (JP)

(73) Assignee: Victor Company of Japan, Ltd., Kanagawa-ken (JP)

( * ) Notice: Subject to any disclaimer, the term of this patent is extended or adjusted under 35 U.S.C. 154(b) by 0 days.

(21) Appl. No.: 09/794,596

(22) Filed: Feb. 27, 2001

(30) Foreign Application Priority Data

Mar. 30, 2000 (JP) ........................................ 2000-095497

(51) Int. Cl.$^7$ ............................................... H01C 1/012
(52) U.S. Cl. ........................ 338/308; 338/328; 29/610.1
(58) Field of Search ................................. 338/308, 309, 338/312, 314, 318, 319, 327, 328, 320, 260; 29/610.1, 610.2

(56) References Cited

U.S. PATENT DOCUMENTS

| | | | |
|---|---|---|---|
| 5,340,775 A | * 8/1994 | Carruthers et al. | ......... 437/246 |
| 5,503,878 A | * 4/1996 | Suzuki et al. | ................ 427/539 |
| 5,849,623 A | * 12/1998 | Wojnarowski et al. | ....... 438/382 |
| 6,025,115 A | * 2/2000 | Komatsu et al. | ............ 430/313 |
| 6,194,990 B1 | * 2/2001 | Lee et al. | .................... 338/320 |

\* cited by examiner

*Primary Examiner*—Elvin Enad
*Assistant Examiner*—Kyung S. Lee
(74) *Attorney, Agent, or Firm*—Anderson Kill & Olick; Eugene Lieberstein; Michael N. Meller

(57) ABSTRACT

The invention provides a production method capable of forming a thin film resistance element having a thickness and a shape controlled in a high accuracy in a printed circuit board. The production method of a thin film resistance element formed on a printed circuit board, has the steps of forming a thin film resistance layer having a predetermined thickness on the printed circuit board through an insulation layer by a dry process used in producing a semiconductor, forming an electrically conductive layer on the thin resistance layer, and etching the electrically conductive layer selectively so as to make, at least, a pair of electrically conductive pads, resulting in the thin film resistance element having a predetermined value of resistivity between the pair of electrically conductive pads. Thereby, it is possible to form the thin film resistance element having a thickness and a shape controlled in a high accuracy on the printed circuit board.

6 Claims, 6 Drawing Sheets

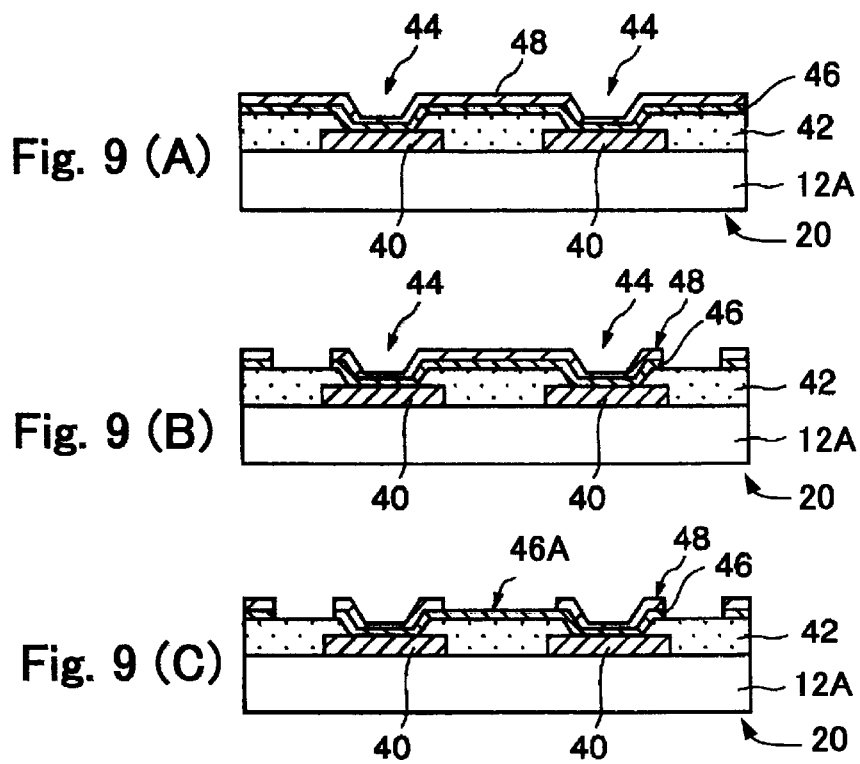
Fig. 9 (A)
Fig. 9 (B)
Fig. 9 (C)
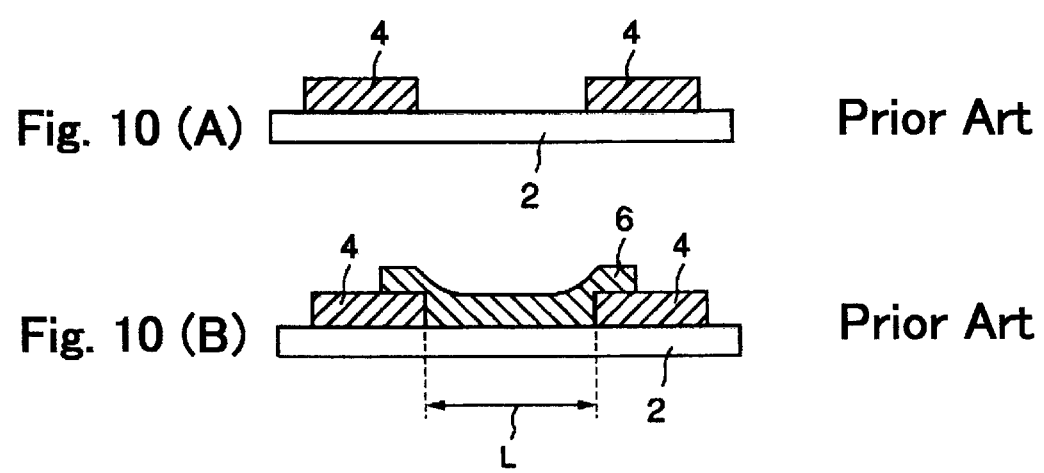
Fig. 10 (A) Prior Art
Fig. 10 (B) Prior Art

PRODUCTION METHOD OF THIN FILM RESISTANCE ELEMENT FORMED ON PRINTED CIRCUIT BOARD, AND THIN FILM RESISTANCE ELEMENT EMPLOYING THE METHOD

BACKGROUND OF THE INVENTION

1. Field of the Invention

The present invention is related to a production method of a thin film resistance element formed on or buried in a printed circuit board, and the thin film resistance element employing the same method, in particular, the production method capable of precisely controlling a thickness and a shape of the thin film resistance element.

2. Description of the Related Arts

Generally, a printed circuited board used in various kinds of electric facilities is further demanded to be reduced in size and weight, in particular, how to install electrically resistance bodies into the printed circuit board is a key not only to reduce the size and weight of the printed circuit board but also to maintain an accuracy value of resistivity of the resistance bodies. As one of examples for forming these resistance bodies in the prior arts, there is one where a printed circuit pattern is formed on, for instance, a ceramic substrate (core) and the resistance bodies are formed by applying an electrical resistance paste on the printed circuit pattern by using a printing method. This printing method has been widely used ever since, and the resistance bodies formed on the printed circuit pattern is referred to as a printed resistance body.

FIGS. 10(A) and 10(B) are sectional views for explaining a production method of a resistance body by a printing method in the prior arts.

Next, a description is given of the production method of the printed resistance body in the prior arts, referring to FIGS. 10(A) and 10(B).

In FIGS. 10(A) and 10(B), a character 2 designates a ceramic substrate (core) with an insulating layer on the surface thereof or maintaining an electrically insulating state. As shown in FIG. 10(A), on the surface of the ceramic substrate 2, an electrically conductive paste of Ag—Pd is applied by, for instance, a screen printing method, resulting in a pair of electrically conductive pads (referred to as conductive pads) 4, 4 separated at a certain distance to each other. Then, on the surface of the ceramic substrate 2, an electrical resistance paste is applied by the screen printing method, resulting a printed resistance body 6 between the pair of conductive pads 4, 4 separated to each other at a predetermined distance L as shown in FIG. 10(B).

The value of resistivity of the printed resistance body 6 depends on the dimensions of the printed resistance body 6, i.e., a resistance length L, a resistance width W (not shown) and a thickness t of the printed resistance body 6. Since the value of resistivity of the printed resistance body 6 is varied according to the dimensions, there arise problems as follows.

First, upon applying the electrically conductive paste and the resistance paste on the ceramic substrate 2 by the screen printing method, a shift of printing and penetration of these pastes inevitably occur, resulting in a deviation of value of resistivity in the printed resistance body 6.

In particular, a thickness of the resistance paste printed on the ceramic substrate 2 varies largely because of a difficulty to control printing conditions such as a squeezing pressure, a squeezing angle and a viscosity of resistance paste, resulting in an increase of the deviation of value of resistivity in the printed resistance body 6.

The conductive pads 4 made of Cu (copper) give poor ohmic contact. This causes a generation of an excess value of resistivity at connecting portions of the conductive pads 4. This fact poses a difficulty to obtain a designed value of resistivity with the printed resistance body 6.

Generally speaking, the deviation of value of resistivity thereby is as large as about ±30%. This fact implies to require an additional adjustment process such as trimming for correcting the value of resistivity to a designed value at the final stage.

SUMMARY OF THE INVENTION

Accordingly, it is a general object of the present invention to provide a production method of a thin film resistance element formed on a printed circuit board (core material), and the thin film resistance element produced by the same method, in which above disadvantages have been effectively eliminated.

More specific object of the present invention is to provide a production method of a thin film resistance element formed on a printed circuit board, and the thin film resistance element produced by the same method, wherein the thin film resistance element can be formed in such a manner that the dimensions such as the thickness thereof are controlled in high accuracy.

Another specific object of the present invention is to provide a production method of a thin film resistance element formed on a printed circuit board, comprising the steps of forming a thin film resistance layer having a predetermined thickness on the printed circuit board through an insulation layer by a dry process used in producing a semiconductor; forming an electrically conductive layer on the thin resistance layer, and etching the electrically conductive layer selectively so as to make, at least, a pair of electrically conductive pads, resulting in the thin film resistance element having a predetermined value of resistivity between the pair of electrically conductive pads.

Another more specific object of the present invention is to provide a thin film resistance element formed on a printed circuit board having a circuit pattern on a substrate and an insulation layer covering the circuit pattern having a thin film resistance element formed on the insulation layer of the printed circuit board by a dry process used in fabricating semiconductors; and at least, a pair of electrically conductive pads formed on the thin film resistance layer, the pair of electrically conductive pads being separated at a predetermined distance to form a thin film resistance element between the pair of electrically conductive pads.

BRIEF DESCRIPTION OF THE DRAWINGS

FIGS. 9(A) to 9(C) are sectional views for explaining a production method of a thin film resistance element in a eighth embodiment in the present invention, wherein the thin film resistance element is electrically connected to a circuit pattern formed in an inner layer of a printed circuit board; and FIGS. 10(A) and 10(B) are sectional views for explaining a production method of a resistance body by a printing method in the prior arts.

DETAILED DESCRIPTION OF THE PREFERRED EMBODIMENTS

Reference will now be made in detail to preferred embodiments of a thin film resistance element or body (referred as thin film resistance element hereinafter) in the present invention, examples of which are illustrated in the accompanying drawings.

Figure 1:
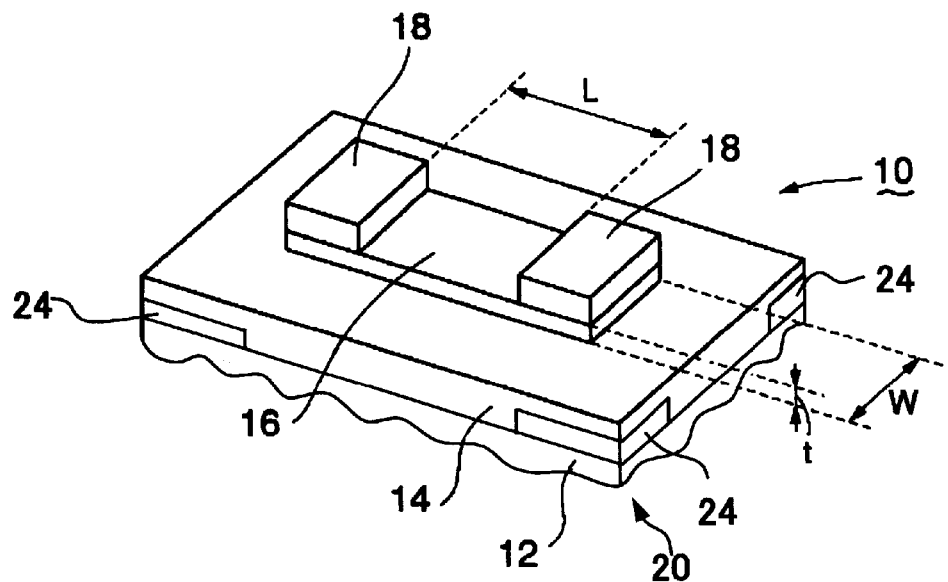
FIGS. 1(A) and 1(B) are perspective views for explaining a thin film resistance element of a first embodiment in the present invention.
Figure 1:
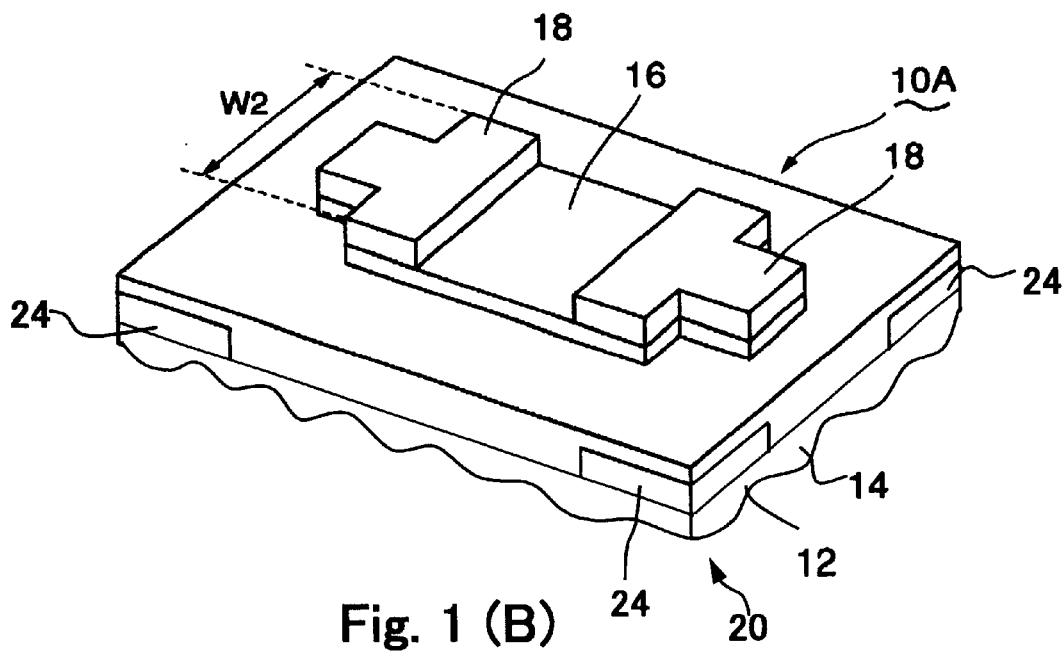

FIGS. 1(A) and 1(B) are perspective views for explaining a thin film resistance element of a first embodiment in the present invention.

In the present invention, a thin film resistance element 10 is formed or buried by using a different method from the screen printing method in the prior arts.

Referring to FIG. 1(A), a character 20 represents a printed circuit board (core material) comprising a core 12 or a substrate 12, for instance, made of resin, a thin copper plate 24 having a circuit pattern and an insulation layer 14.

As shown in FIG. 1(A), the thin film resistance element 10 of a first embodiment in the present invention is formed on the surface of an insulation layer 14 of the printed circuit board 20. In this case, the insulation layer 14 is formed on the printed circuit board (core material) 20. As another example, the insulation layer 14 may be formed on a top of a plurality of different type layers accumulated on the printed circuit board (core material) 20, as mentioned hereinafter.

The above thin film resistance element 10 formed on the insulation layer 14 is composed of a thin film resistance layer 16 having, for instance, a rectangular shape as a pattern and a pair of electrically conductive pads (referred to as conductive pads) 18, 18 made of, for instance, copper, each formed on an distal end portion of the rectangular shape. The value of resistivity of the thin film resistance element 10 depends on a thickness t and dimensions of the pattern formed in the thin film resistance layer 16, i.e., a resistance width W and a resistance distance L defined by a distance between the pair of conductive pads 18, 18 separating to each other.

The above thin film resistance layer 16 is formed by the dry process which is widely used for producing semiconductors. The dry process includes a spattering method, an ion plating, a vapor deposition and a CVD (Chemical Vapor Deposition) method. The feature of the dry process for forming the thin film is to easily control a thickness of the thin film. Thereby, it is possible to obtain a thin film with a desired thickness in high accuracy compared with the screen printing method in the prior arts. Further, in the dry process, a photolithography method is used for forming a pattern in a thin film. The accuracy of the pattern obtained thereby is better than that by the screen printing method.

In order to form the pair of conductive pads 18, 18, an electrically conductive layer (referred to as conductive layer) (not shown) is formed on the whole surface of the insulation layer 14 on which the thin film resistance layer 16 is formed. The conductive layer is selectively etched in such a manner that a part of the thin film resistance layer 16 is exposed so as to have a predetermined shape (a resistance length L and a resistance width W), remaining the pair of conductive pads 18. As well known, the value of resistivity of the thin film resistance element 10 is proportional to a product of the resistance length L and the resistance width W as mentioned in the foregoing. Thereby, it is possible to obtain a desired value of resistivity of the thin film resistance element 16.

Further, a contact layer (not shown) may be provided on the insulation layer 14 made of, for instance, resin, so as to enhance adhesion between the insulation layer 14 and the conductive layer made of, for instance, Cu, for forming the conductive pads 18, 18. In this case, the thin film resistance element 16 is formed on the contact layer before the conductive layer is formed.

Specifically, as the present applicant stated in the previous application (the Japanese Patent Application No. H11-95469/1999), it is difficult to cause the conductive layer to sufficiently contact with the insulation layer processed by a conventional surface treatment when a fine pattern is needed. Thus, the applicant proposed to provide the contact layer between the insulation layer and the conductive layer by using the dry process. In this embodiment, the thin film resistance layer 16 is formed on the contact layer (not shown) by using a patterning method. As the materials of the thin film resistance layer 16, many kinds of resistance materials such as Ni, Ni—Cr, and Ni—Cu are available.

In FIG. 1(A), there is illustrated a basic model of the thin film resistance element 10 in the first embodiment of the present invention, and in FIG. 1(B) a variation 10A of the thin film resistance element 10 is illustrated, wherein the shapes of the conductive pads 18, 18 and the thin film resistance layer 16 are more complicated than those of the thin film resistance element 10 shown in FIG. 1(A). Specifically, the conductive pads 18, 18 along with the end portions of the thin film resistance layer 16 shown in FIG. 1(A) have a rectangular shape but the ones (18, 18 and 16) shown in FIG. 1(B) have a T-letter shape, respectively. This implies that according to the present invention, it is possible to form any shape of the thin film resistance element.

Figure 2:
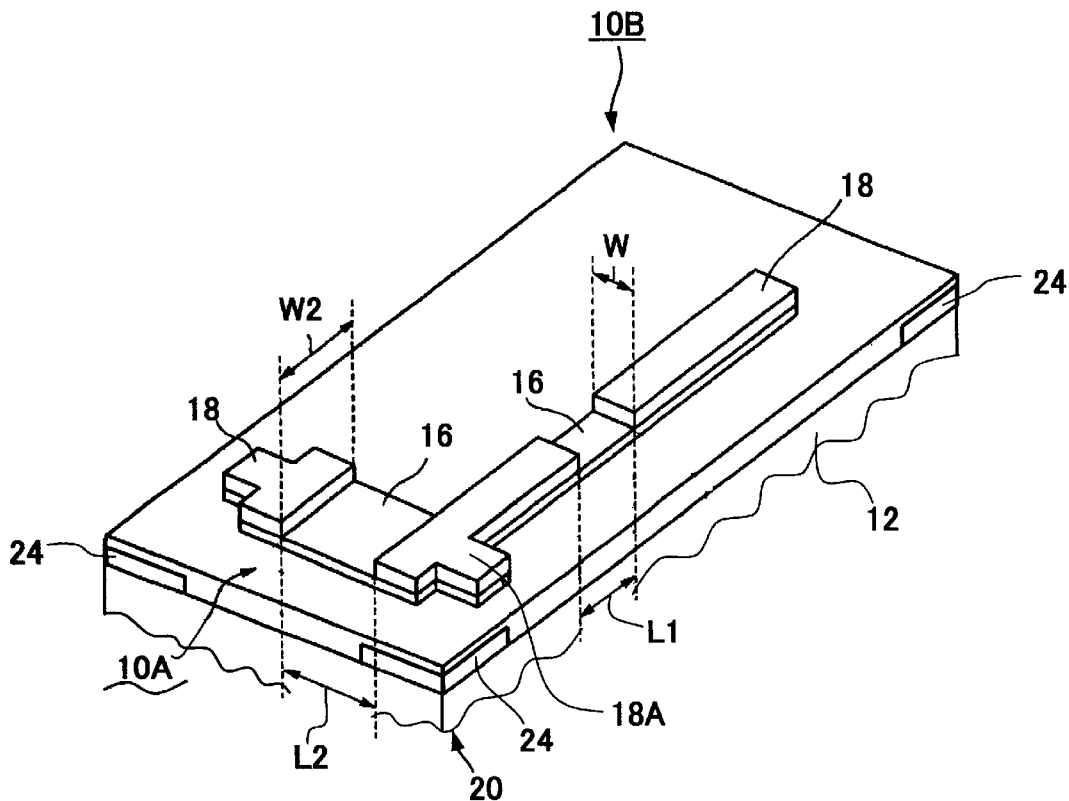
FIG. 2 is a perspective views for explaining a thin film resistance element of a second embodiment in the present invention.

FIG. 2 is a perspective views for explaining a thin film resistance element of a second embodiment in the present invention.

In a thin film resistance element 10B of the second embodiment shown in FIG. 2, a middle conductive pad 18A is commonly provided so as to electrically connect the thin film resistance element 10 shown in FIG. 1(A) and the thin film resistance element 10A shown in FIG. 1(B) in series, wherein the resistance lengths of the thin film resistance elements 10, 10A are made to be L1 and L2, respectively, and the resistance widths of the thin film resistance elements 10, 10A are made to be W and W2, respectively.

Figure 3:
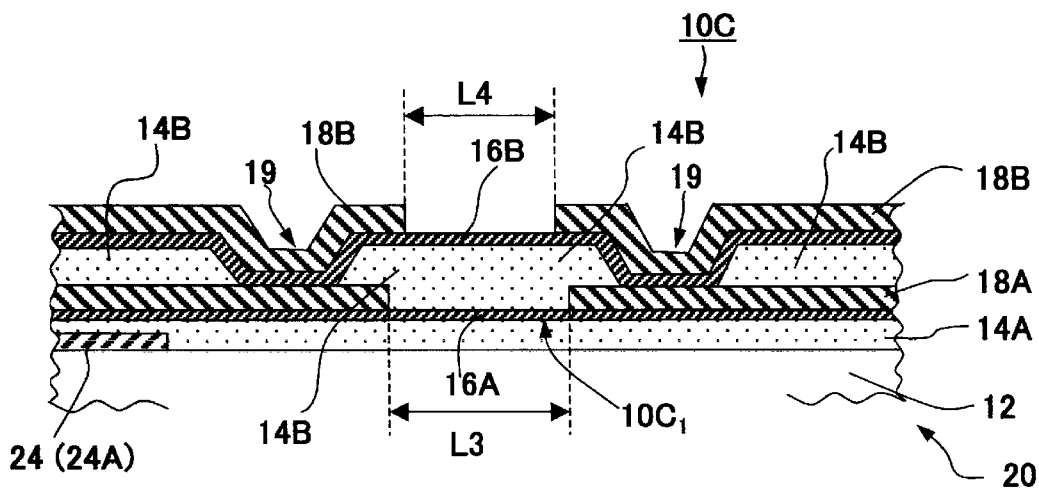
FIG. 3 is a sectional view for explaining a thin film resistance element of a third embodiment in the present invention.

FIG. 3 is a perspective views for explaining a thin film resistance element of a third embodiment in the present invention.

Further, in a thin film resistance element 10C of the third embodiment shown in FIG. 3, the present invention is applied to a build-up printed circuit board (containing a build-up multilayer printed circuit board).

In FIG. 3, a character 20 represents a printed circuit board (core material) comprising a core or substrate (resin) 12, a thin copper plate 24 having a circuit pattern 24A attached on the core or substrate 12 and a lower insulation layer 14A covering the thin copper plate 24A. In this embodiment, on the printed circuit board (core material) 20, a lower thin film resistance element $10C_1$ and an upper thin film resistance element 10C are stacked so that they are electrically connected in parallel.

Specifically, in the same manner as mentioned in FIGS. 1(A) and 1(B), the lower thin film resistance layer 16A is formed on the printed circuit board (core material) 20 through the lower insulation layer 14A, and a pair of lower conductive pads 18A, 18A is formed on the lower thin film resistance layer 16A so as to oppose each other, resulting in the lower thin film resistance element $10C_1$. On the lower thin film resistance element $10C_1$, an upper insulation layer 14B is formed. In the upper insulation layer 14B, a pair of via holes 19, 19 is form to reach the pair of lower conductive pads 18A, 18A. On the upper insulation layer 14B, an upper resistance thin film resistance layer 16B is formed so that it is electrically connected to the pair of lower conductive pads 18A, 18A through the pair of via holes 19, 19. On the upper thin film resistance layer 16B, there is formed a pair of upper conductive pads 18B, 18B separated at a distance L, resulting in the upper thin film resistance element 10C electrically connected to the lower thin film resistance element $10C_1$ in parallel.

Here, the resistance length of the lower thin film resistance element $10C_1$ is made to be L3 defined by the separated distance between the pair of lower conductive pads 18A, 18A opposing to each other, and the resistance length of the upper thin resistance element 10C is made to be L4 defined by the separated distance between the pair of upper conductive pads 18B, 18B opposing to each other.

FIGS. 4(A) to 4(F) are sectional views for explaining a production method of the thin film resistance element of the present invention.

Figure 4:
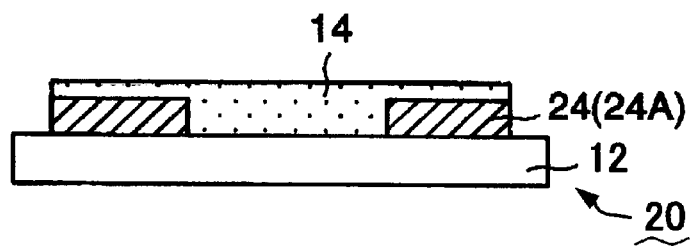
FIGS. 4(A) to 4(F) are sectional views for explaining a production method of the thin film resistance element of the present invention.
Figure 4:
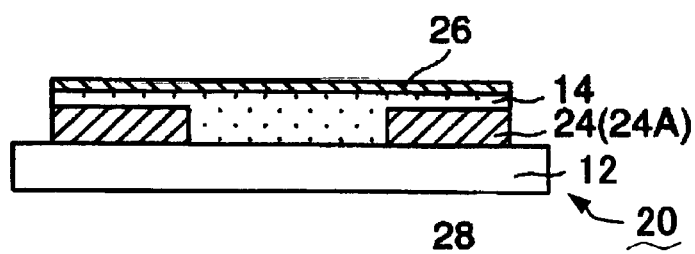
Figure 4:
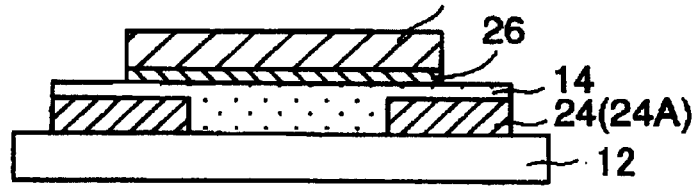
Figure 4:
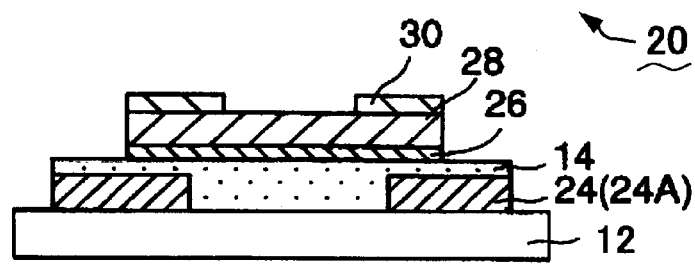
Figure 4:
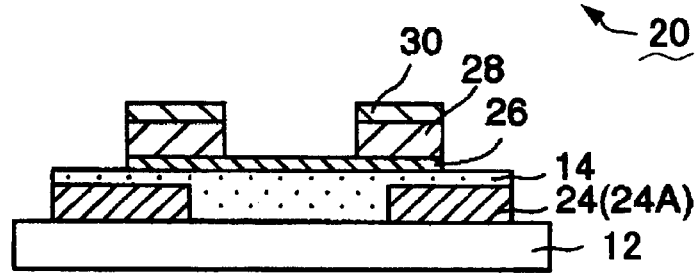
Figure 4:
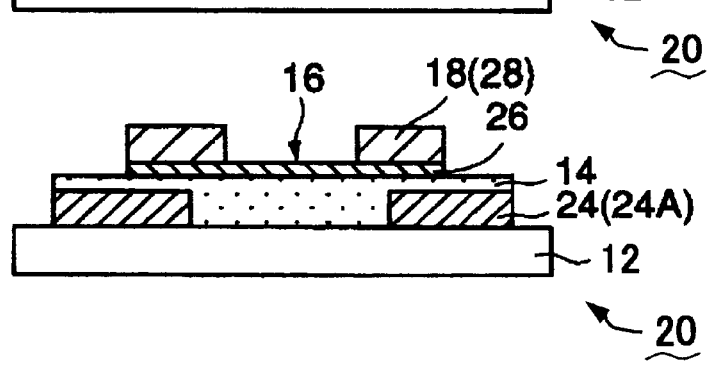

Next, a description is given to a production method of the thin film resistance element 16 of the present invention, referring to FIG. 4(A).

In FIG. 4(A), a numerical character 20 designates a printed circuit board (core material) comprising a core or substrate 12 made of, for instance, resin, a copper plate 24 being attached on the core 12 and an insulation layer 14 coated on the core 12 and the copper plate 24. The copper plate 24 has an inner circuit pattern 24A being wet-etched by, for instance, the photolithography method. The inner circuit pattern 24A is surface-treated by a blackening or a wet etching. On the surface of the inner circuit pattern 24A there is formed an insulation layer 14 by a soft-etching method. Then, the insulation layer 14 is surface-treated (roughed or activated) through a dry or wet process.

Next, as shown in FIG. 4(B), on the insulation layer 14, a thin film resistance layer 26 having a given thickness, for instance, of 15 μm is deposited by the dry process like as the sputtering method by using a resistance material (for instant, Ni: 99.9%). The thin film resistance layer 26 is formed, for instance, under following conditions.

Type of a gas to be used: Ar, a pressure of the gas: 0.4 Pa (3 mTorr), an output of CD power: 400 W, and a temperature: the room temperature. In this case, it has been confirmed that a thickness deviation of the thin film resistance layer 26 is about ±5% to the given thickness of 15 μm. This implies that the accuracy of the film thickness by this method is much better than that of the printed resistance body by the printing method using the resistance paste in the prior art, wherein the thickness deviation of the printed resistance body is about ±20%. Further, a deviation of the dimensions in the pattern of the thin film resistance layer 26 is about ±5%.

Next, as shown in FIG. 4(C), a conductive layer 28 made of, for instance, Cu is formed on the thin film resistance layer 26 by an electric plating method. Further, a pattern as an outer layer is formed in the conductive layer 28 by the photolithography method. In particular, in the case of using a resistance material having a high resistivity, prior to forming the conductive layer 28, a thin film layer of Cu may be formed on the thin film resistance layer 26 by the spattering method to enhance the electrical conductivity between the thin film resistance layer 26 and the conductive layer 28. This thin film layer of Cu enables to form an excellent conductive layer 28 by the electric plating method. In this case, both the conductive layer 28 and the thin film resistance layer 26 are etched to form a pattern therein. For example, for etching both the conductive layer 28 made of Cu and the thin film resistance layer 26 made of Ni at the same time, the solution of cupric chloride is used. Needless to say, they can be etched separately or at the same time according to a desired design.

Next, as shown in FIG. 4(D), as a mask material of a selecting etching, for instance, a photo-solder resist 30, which is usually used as a protection layer, is coated on the conductive layer 28 by the screen printing method. Then, a pattern for making a thin film resistance element 16 is formed on the photo-solder resist 30 by exposing and developing the photo-solder resist 30. It is preferable that the photo-solder resist 30 has excellent resistance to alkalis to resist the alkali etching solution used in the next step.

Next, as shown in FIG. 4(E), the conductive layer 28 is etched excepting the portion masked with the photo-solder resist 30. Usually, as an etching solution for Cu, an acid system etching solution may be used. In this embodiment, however, the alkali system etching solution is used to selectively etch out the conductive layer 28 made of Cu, remaining the thin film resistance layer 26 formed under the conductive layer 28. As the etching solution, for instance, A-process solution (Meltex) is available. The etching was performed by a spray method for 60 sec under a temperature of 45° C. As a result, a portion of the conductive layer 28 of Cu without the photo-solder resist 30 is perfectly etched out, remaining the masked portion, and the thin film resistance layer 26 formed under the conductive layer 28 is exposed.

The surface of the thin film resistance layer 26 exposed was evaluated by using the ESCA (Electron Spectroscopy for Chemical Analysis) (ULVACΦ). As the result of evaluation, a peak value of Ni and a thickness of the thin film resistance layer (Ni) 26 were no difference between the initial state and the state after being etched.

Next, as shown in FIG. 4(F), the photo-solder resist 30 of the masking portion is removed from the conductive layer 28 by using a separating solution, resulting in a pair of pads 18, 18. As the separating solution, Resist Stripper 9296 (Nippon MacDamid Co. Ltd.) is available.

As mentioned above, since the patterning shows in FIGS. 4(D), 4(E) and 4(F) is performed by using the photolithography process, it is possible to obtain the thin film resistance element 16 having the dimensions accuracy of about ±5%, which is better than the dimensions accuracy of about ±10% of the one formed with the resistance paste by the screen printing method in the prior arts.

This fact implies that the production method of the thin film resistance element 16 according to the invention is an excellent one capable of controlling the dimensions thereof in high accuracy, accordingly capable of reducing a deviation of value of resistivity of the thin film resistance element 16 compared with that in the prior arts.

Figure 5:
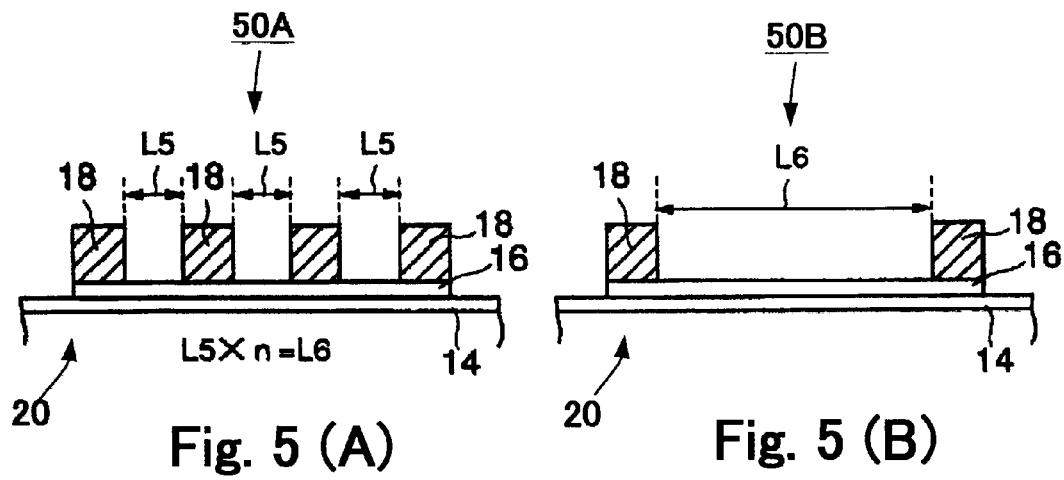
FIGS. 5(A) and 5(B) are sectional views for explaining a thin film resistance element of a fourth embodiment in the present invention.

FIGS. 5(A) and 5(B) are sectional views for explaining a thin film resistance element of a fourth embodiment in the present invention.

Generally speaking, a thin film resistance element generates a heat, which raises a temperature of it when a current flows through the thin film resistance element. It is just the same with the thin film resistance element 16 mentioned in FIG. 4(F). The degree of the temperature rise depends on a current density, an electric resistance material and an installed state of the thin film resistance element. For instance, the thin film resistance element formed in an inner layer has a worse heat dissipation characteristic than that of the one formed on an outer layer because the thin film resistance element of the inner layer is sandwiched by lower and upper insulation layers (resin), resulting in a high temperature rise compared with the one formed on the outer layer.

Thus, the description is given to a thin film resistance element 50A of a fourth embodiment in the present invention, wherein the heat dissipation of the thin film resistance element 50A is improved.

Referring to FIG. 5(A), in the thin film resistance element 50A of a fourth embodiment in the present invention, a plurality of small thin film resistance elements are electrically connected in series.

Specifically, on the printed circuit board 20 (core material) having the insulation layer 14 thereon, a thin film resistance layer 16 is formed, and a plurality of conductive pads 18 are formed on the thin film resistance layer 16, each separated at a distance L5. Thus, a real resistance length of the thin film resistance element 50A is represented as L5×n, wherein a character n designates a number of the small thin film resistance elements, each formed between the opposite pads 18. Here, the value of L5×n is made to be a resistance length of L5.

In FIG. 5(B), there is illustrated a thin film resistance element 50B having a resistance length of L5. When the thin film resistance element 50A shown in FIG. 5(A) is compared with the thin film resistance element 50B shown in FIG. 5(B), the thin film resistance element 50A has a better heat dissipation than that of the thin film resistance element 50B because a total surface area of the conductive pads 18 is larger than that of the thin film resistance element 50B. This fact enables to input a large electric power to the thin film resistance element 50A compared with the thin film resistance element 50B.

Figure 6:
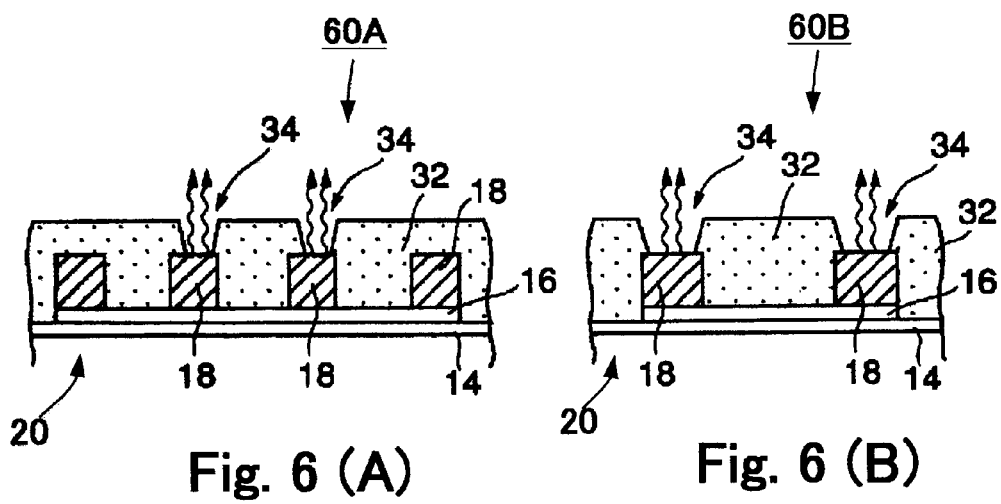
FIGS. 6(A) and 6(B) are sectional views for explaining a thin film resistance element of a fifth embodiment in the present invention.

FIGS. 6(A) and 6(B) are sectional views for explaining a thin film resistance element of a fifth embodiment in the present invention.

Referring to FIGS. 6(A) and 6(B), the thin film resistance elements 50A and 50B shown in FIGS. 5(A) and 5(B) are installed in an inner layer made of an insulation layer (resin) 32, respectively. In this case, it is preferable to provide recesses 34 such as holes or ditches in the insulation layer 32 to expose top surfaces of the conductive pads 18 so that the thin film resistance elements 50A or 50B may effectively dissipates the heat generated from themselves.

Figure 7:
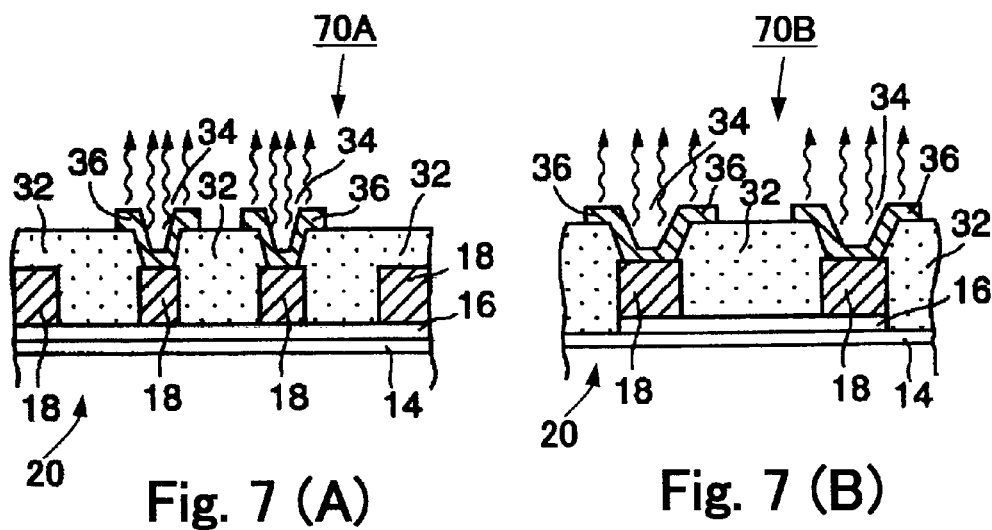
FIGS. 7(A) and 7(B) are sectional views for explaining a thin film resistance element of a sixth embodiment in the present invention.

FIGS. 7(A) and 7(B) are sectional views for explaining a thin film resistance element of a sixth embodiment in the present invention.

As shown in FIGS. 7(A) and 7(B), in the thin film resistance elements 70A, 70B of a sixth embodiment, the thin film resistance elements 50A and 50B shown in FIGS. 6(A) and 6(B) are further provided with thermally conductive layers 36 made of, for instance an electrically conductive material on inner surfaces of the recesses 34 to effectively increase the heat dissipation.

Figure 8:
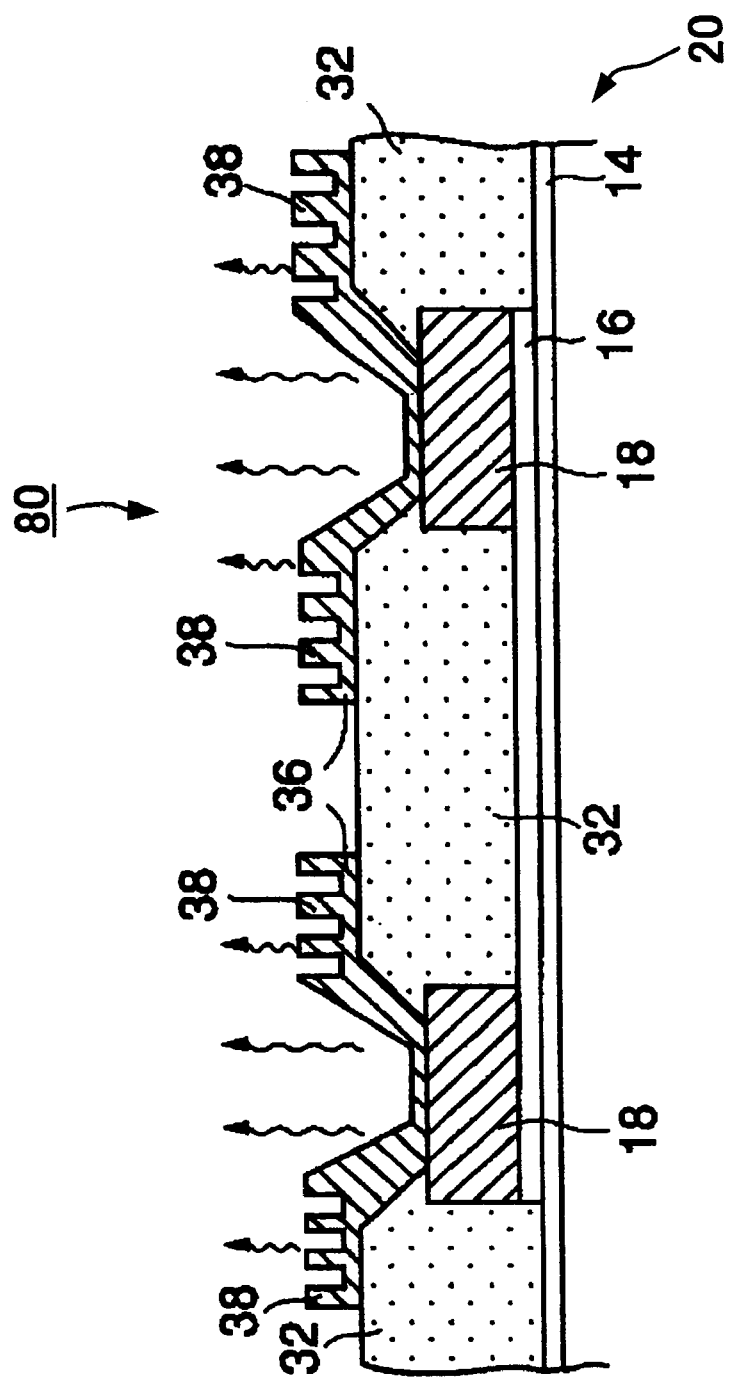
FIG. 8 is a sectional view for explaining a thin film resistance element of a seventh embodiment in the present invention.

FIG. 8 is a sectional view for explaining a thin film resistance element of a seventh embodiment in the present invention.

As shown in FIG. 8, in the thin film resistance elements 80 of a seventh embodiment, the thin film resistance element 70B shown in FIG. 7(B) is further provided with fins 38 having a concavity or a convexity on a surface of the conductive layer 36 extending to a flat surface of the insulation layer 32, so that a surface area of the conductive layer 36 is increased. The fins 38 having the concavity or the convexity can be formed on the conductive layer 36 by using the photolithography method, a laser processing or a roughing treatment. Thereby, more effective heat dissipation is expected of the thin film resistance element 80.

In the production method of the thin film resistance elements referred to FIGS. 4(A) to 4(F), the description is given to the embodiment where the thin film resistance elements 16 is formed on the same plane, however, the present invention is not limited to the above embodiment. The production method is applicable to the cases where the thin film resistance element of the present is connected to another circuit pattern formed in the same plane (layer) or a different plane (layer) through a via hole which has a function for electrically connecting one circuit to another circuit formed in the different layer.

FIGS. 9(A) to 9(C) are sectional views for explaining a production method of a thin film resistance element in a eighth embodiment in the present invention, wherein the thin film resistance element is electrically connected to a circuit pattern formed in an inner layer of a printed circuit board.

Referring to FIG. 9(A), a character 20 designates a printed circuit board (core material) which comprises a core or substrate (resin) 12A, an inner circuit pattern 40 and an insulation layer 42 formed to cover the inner circuit pattern 40. In the insulation layer 42 a pair of via holes 44, 44 is formed to expose desired parts of the inner circuit pattern 40. A thin film resistance layer 46 is formed on the insulation layer 42, resulting that the thin film resistance layer 46 is electrically connected to the desired parts of the inner circuit pattern 40 through the pair of via holes 44, 44. On the thin film resistance layer 46, there is formed a conductive layer 48, for instance, made of Cu.

As shown in FIG. 9(B), in order to make a thin film resistance element 46A (shown in FIG. 9(C)), a pair of portions stacked with the thin film resistance layer 46 and the conductive layer 48 is removed by the patterning and etching methods, as mentioned in FIG. 4(C) in the foregoing. Next, as shown in FIG. 9(C), a part of the conductive layer 48 of Cu is etched to expose the thin film resistance layer 46, as mentioned in FIGS. 4(E) and 4(F) in the foregoing. Thus, the thin film resistance element 46A connected to the inner circuit pattern 40 of the printed circuit board 20 can be obtained.

According to this method, it is possible to optionally form the thin film resistance element on the printed circuit board 20 and to electrically connect the thin film resistance element 46A to the inner circuit pattern 40 of the printed circuit board 20 through the via holes 44.

As mentioned in the foregoing, according to the thin film resistance element and the production method thereof, it is possible to exert excellent effects as follows.

According to the production method of a thin film resistance element formed on a printed circuit board (core material) in the present invention, the method includes the steps of forming a thin film resistance layer having a predetermined thickness on the printed circuit board through an insulation layer by a dry process used in producing a semiconductor; forming an electrically conductive layer on the thin resistance layer; and etching the electrically conductive layer selectively so as to make, at least, a pair of electrically conductive pads, resulting in the thin film resistance element having a predetermined value of resistivity between the pair of electrically conductive pads. Thus, it is possible to form the thin film resistance element having a thickness and a shape controlled in a high accuracy thereon. For instance, the electric resistance body formed with the resistance paste in the prior arts has a deviation of value of resistivity as large as ±30% to a desired value. On the contrary, the thin film resistance element of the present invention has a deviation of value of resistivity as small as ±10%. As a result, it is possible to obtain the thin film resistance element having a high accuracy and an excellent ohmic contact.

According to a thin film resistance element in the present invention, it is possible to install means for dissipating a heat generated from the thin film resistance element thereto. Thereby, it is possible flow a large current into the thin film resistance element.

Further, according to a production method of thin film resistance element in the present invention, it is possible to electrically connect the thin film resistance element to an inner circuit pattern and an inner resistance element formed in an inner layer through via holes. Thereby, it is possible to compactly fabricate a multi layer printed circuit board.

It will be apparent to those skilled in the art that various modification and variations could be made in the thin film resistance element in the present invention without departing from the scope or spirit of the invention.

What is claimed is:

1. A production method of a thin film resistance element formed on a printed circuit board having an insulation layer, comprising the steps of:

roughening or activating a surface of the insulation layer by a dry process used in producing a semiconductor;

forming a thin film resistance layer having a predetermined thickness on the roughened or activated surface of the insulation layer by a dry process used in producing a semiconductor and in a vacuum such that the insulation layer is not oxidized during the formation of the thin film resistance layer;

forming an electrically conductive layer on the thin film resistance layer;

forming a first copper layer on the thin film resistance layer by a sputtering method;

forming a second copper layer on the first copper layer by an electric plating method; and etching the electrically conductive layer selectively so as to make, at least, a pair of electrically conductive pads, resulting in the thin film resistance element having a predetermined value of resistivity between the pair of electrically conductive pads.

2. The production method as claimed in claim 1, wherein the thin film resistance layer is formed in a process of fabricating a build up printed circuit board that has multi-layers alternately stacked with an inner insulation layer and an inner electrically conductive layer having an inner circuit pattern on a substrate.

3. The production method as claimed in claim 2, further comprising the step of forming a via hole in the inner insulation layer so as to electrically connected to the thin film resistance layer to the inner electrically conductive layer through the via hole.

4. A printed circuit board having a thin film resistance element produced by the production method comprising the steps of:

roughening or activating a surface of the insulation layer by a dry process used in producing a semiconductor;

forming a thin film resistance layer having a predetermined thickness of the insulation layer by a dry process used in producing a semiconductor and in a vacuum such that the insulation layer is not oxidized during the formation of the insulating layer;

forming an electrically conductive layer on the thin film resistance layer;

forming a first copper layer on the thin film resistance layer by a sputtering method;

forming a second copper layer on the first copper layer by an electrical plating method; and etching the electrically conductive layer selectively so as to make at least a pair of electrically conductive pads, resulting in the thin film resistance element having a predetermined value of resistivity between the pair of electrically conductive pads.

5. A build up printed circuit board having a thin film resistance element formed by the production method as claimed in claim 4, wherein the thin film resistance element is formed in a process of fabricating the build up printed circuit board that has multi-layers alternatively stacked with an inner insulation layer and an inner electrically conductive layer having an inner circuit pattern on a substrate.

6. The build up printed circuit board having a thin film resistance element as claimed in claim 5, the production method further comprising the step of forming a via hole in the inner insulation layer so as to electrically connected to the thin film resistance layer to the inner electrically conductive layer through the via hole.

* * * * *